(12) United States Patent
Huang et al.

(10) Patent No.: US 11,832,421 B2
(45) Date of Patent: Nov. 28, 2023

(54) CONTROL DEVICE

(71) Applicant: Beijing Tusen Zhitu Technology Co., Ltd., Beijing (CN)

(72) Inventors: Weiwei Huang, Beijing (CN); Yu Zhang, Beijing (CN); Jianan Hao, Beijing (CN)

(73) Assignee: BEIJING TUSEN ZHITU TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/650,074

(22) Filed: Feb. 4, 2022

(65) Prior Publication Data

US 2022/0256741 A1 Aug. 11, 2022

(30) Foreign Application Priority Data

Feb. 6, 2021 (CN) .......................... 202120341604.8

(51) Int. Cl.
*H05K 7/20* (2006.01)
*H05K 1/02* (2006.01)

(52) U.S. Cl.
CPC ....... *H05K 7/20409* (2013.01); *H05K 1/0209* (2013.01); *H05K 7/20727* (2013.01)

(58) Field of Classification Search
CPC ......... H05K 7/20409; H05K 7/207272; H05K 1/0209
See application file for complete search history.

(56) References Cited

U.S. PATENT DOCUMENTS

| 5,522,700 A | 6/1996 | Hong |
| 5,927,385 A | 7/1999 | Yeh |
| 6,512,673 B1 | 1/2003 | Wiley |

(Continued)

FOREIGN PATENT DOCUMENTS

| CN | 208752563 U | 4/2019 |
| CN | 210294790 U | 4/2020 |

(Continued)

OTHER PUBLICATIONS

JP 2021197512 A, translation (Year: 2021).*
European Patent Office, Extended European search report for EP 22154620.3, dated Jul. 18, 2022, 9 pages.

*Primary Examiner* — Mukundbhai G Patel
(74) *Attorney, Agent, or Firm* — Perkins Coie LLP

(57) ABSTRACT

The present disclosure discloses a control device, which comprises: a circuit board; a heat dissipation cover comprising a heat dissipation cover plate and a plurality of heat dissipation fins arranged on the heat dissipation cover plate, wherein the heat dissipation cover plate covers the circuit board, and a groove is formed between the plurality of heat dissipation fins; a thermally conductive strip disposed between the circuit board and the heat dissipation cover plate; and a fan arranged in the groove. The heat dissipation cover disclosed herein covers the circuit board as a holistic upper cover, the heat of the circuit board is conducted to the heat dissipation cover through the thermally conductive strip, and the fan in the through groove generate an airflow to dissipate heat, thereby realizing sealing, dustproof and heat dissipation of the circuit board simultaneously.

20 Claims, 1 Drawing Sheet

(56) References Cited

U.S. PATENT DOCUMENTS

| | | | |
|---|---|---|---|
| 8,854,819 B2 * | 10/2014 | Chen | ............ H01L 23/427 |
| | | | 165/185 |
| 8,988,881 B2 | 3/2015 | Koplow | |
| 2006/0133041 A1 * | 6/2006 | Belady | ............ H05K 1/141 |
| | | | 361/704 |
| 2007/0181287 A1 * | 8/2007 | Peng | ............ H01L 23/3672 |
| | | | 257/E23.099 |
| 2009/0139691 A1 | 6/2009 | Wei | |

FOREIGN PATENT DOCUMENTS

| | | | | |
|---|---|---|---|---|
| CN | 211090372 U | | 7/2020 | |
| EP | 3 745235 | * | 12/2020 | ............ G06F 1/20 |
| JP | 2021197512 A | * | 12/2021 | ............ H05K 7/20 |

\* cited by examiner

CONTROL DEVICE

The present disclosure claims priority to Chinese Patent Application No. 202120341604.8, titled "CONTROL DEVICE", filed on Feb. 6, 2021, the content of which is incorporated herein by reference in its entirety.

TECHNICAL FIELD

The present disclosure relates to a control device having heat dissipation functions.

BACKGROUND

At present, server devices in the market dissipate heat in a built-in air duct, and this heat dissipation mode is to send an airflow into the device from the outside and then extract the airflow out, so that external dust particles are easily brought into the device. With the long-term use of the device, particles such as dust have accumulated on the circuit board, thereby affecting the usability of the device and reducing the service life of the device. Moreover, when there are more heat-dissipating elements, more thermally conductive channels such as copper pipes are designed inside to conduct heat to a heat dissipation strip at a certain position, and at this point, the mounting of the thermally conductive channels is very troublesome.

SUMMERY

The server devices can be affected with the accumulation of dusts inside the server devices. Some implementations of the disclosed technology provide a control device with an improved dust resistance. In addition, in recognition of the space limitation inside the control device for mounting heat element, some implementations of the disclosed technology provide the control device designed to improve the heat dissipation efficiency.

According to an aspect of the embodiment of the present disclosure, provided is a control device, comprising: a circuit board; a heat dissipation cover, comprising a heat dissipation cover plate and a plurality of heat dissipation fins arranged on the heat dissipation cover plate, wherein the heat dissipation cover plate covers the circuit board, and a through groove is formed between the plurality of heat dissipation fins; a thermally conductive strip, a first surface of which abutting against the circuit board, and a second surface of which abutting against the heat dissipation cover plate; and a fan, arranged in the through groove and used for generating an airflow parallel to planes of the heat dissipation fins.

Optionally, according to an embodiment of the present disclosure, the circuit board comprises: a substrate for integrating sensor communication chips; and a mainboard above (or erected on) the substrate for integrating control chips.

Optionally, according to an embodiment of the present disclosure, the thermally conductive strip comprises: a substrate thermally-conductive strip, a first surface of which abutting against the substrate, and a second surface of which abutting against the heat dissipation cover plate; and a mainboard thermally-conductive strip, a first surface of which abutting against the mainboard, and a second surface of which abutting against the heat dissipation cover plate.

Optionally, according to an embodiment of the present disclosure, a plurality of first convex plates are arranged on the substrate, and each first convex plate abuts against a substrate thermally-conductive strip through a thermally conductive silicone pad; a plurality of second convex plates are arranged on the mainboard, and each second convex plate abuts against a mainboard thermally-conductive strip through a thermally conductive silicone pad.

Optionally, according to an embodiment of the present disclosure, the plurality of heat dissipation fins comprise: a first set of heat dissipation fins at a first end of the heat dissipation cover plate; and a second set of heat dissipation fins at a second end of the heat dissipation cover plate, the height of which being the same as that of the first set of heat dissipation fins, and the through groove being formed between the second set of heat dissipation fins and the first set of heat dissipation fins.

Optionally, according to an embodiment of the present disclosure, the plurality of heat dissipation fins further comprise: a third set of heat dissipation fins between the first set of heat dissipation fins and the second set of heat dissipation fins, the height of which being less than that of the first set of heat dissipation fins, and the through groove being formed between the third set of heat dissipation fins, the first set of heat dissipation fins and the second set of heat dissipation fins.

Optionally, according to an embodiment of the present disclosure, the control device further comprises: a fan bracket erected on the through groove, a cavity for mounting the fan being formed between the fan bracket and the first set of heat dissipation fins, the second set of heat dissipation fins and the third set of heat dissipation fins.

Optionally, according to an embodiment of the present disclosure, the fan comprise a first fan and a second fan; the fan bracket comprises a first air vent corresponding to the first fan and a second air vent corresponding to the second fan.

Optionally, according to an embodiment of the present disclosure, the control device further comprises: a bottom shell for supporting the substrate, wherein a plurality of third convex plates are arranged on the bottom shell, and each third convex plate abuts against a back surface of the substrate through a thermally conductive silicone pad so as to conduct heat of the substrate to the bottom shell.

Optionally, according to an embodiment of the present disclosure, the control device further comprises a front vertical plate, a rear vertical plate, a left vertical plate and a right vertical plate, a closed cavity for fixing and protecting the circuit board being formed between the front vertical plate, the rear vertical plate, the left vertical plate and the right vertical plate, and the heat dissipation cover and the bottom shell.

According to the control device disclosed herein, with sealing design of the circuit board, heat is conducted to the heat dissipation cover through the thermally conductive strip. The heat dissipation cover is a holistic upper cover on which a fan are mounted, and an airflow generated by the fan flows between the heat dissipation fins. The embodiments of the present disclosure ensure not only the sealing and dustproof performance of the device but also good heat dissipation efficiency of the device.

BRIEF DESCRIPTION OF THE DRAWINGS

In order to more clearly illustrate the technical solution of the embodiments of the present disclosure, the drawings required for use in the embodiments of the present disclosure will be briefly described below, and it is obvious that the drawings described below are only some embodiments of the present disclosure, and other drawings can be derived from these drawings by those of ordinary skilled in the art without making creative efforts.

DETAILED DESCRIPTION

Figure 1:
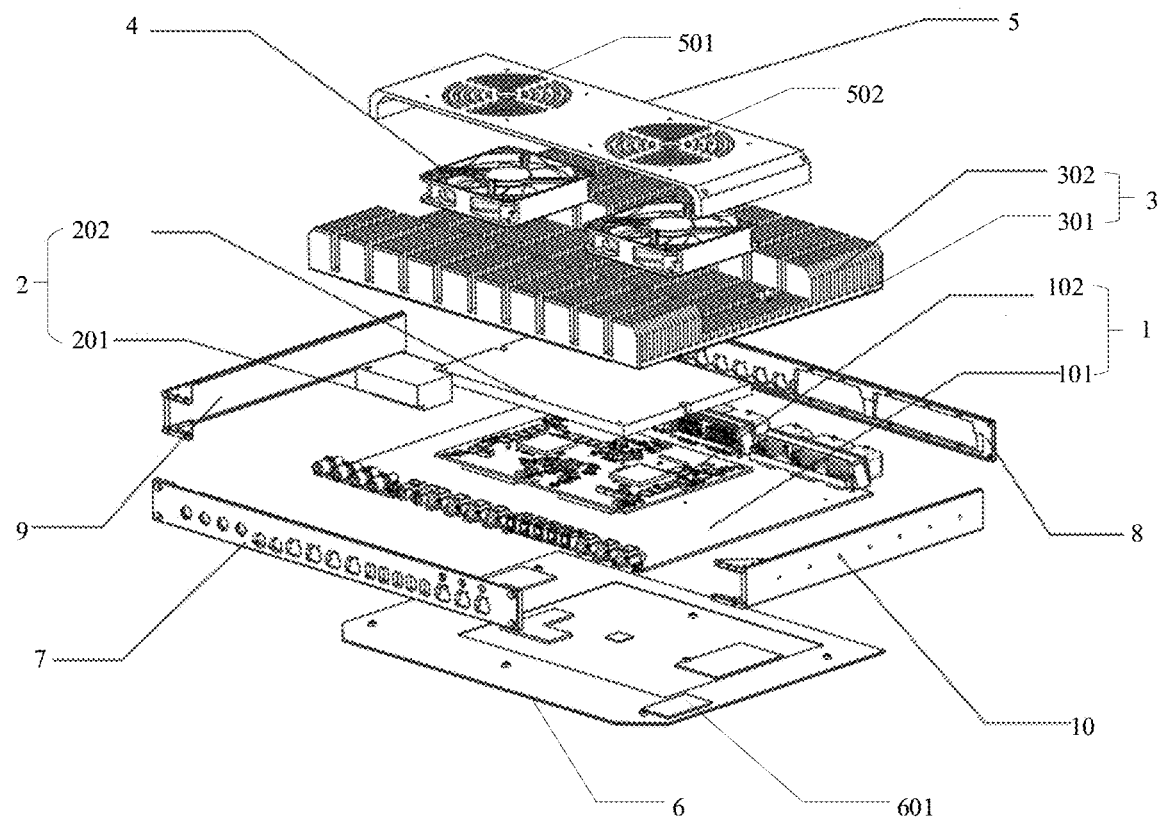
FIG. 1 is an exploded schematic diagram of a structure of a control device according to an embodiment of the present disclosure.

The present disclosure will be further described in detail with reference to the drawings and embodiments. The following detailed description of the embodiments and the drawings are provided to illustrate example implementations of the present disclosure, but are not intended to limit the scope of the present disclosure, i.e., the present disclosure is not limited to the described embodiments.

In the description of the present disclosure, it should be noted that, unless otherwise indicated, the terms "first" and "second" and the like are used for descriptive purposes only and are not to be construed as indicating or implying relative importance; "plurality" means two or more; the terms "inner", "outer", "top", "bottom" and the like that indicate orientations or positional relationships are based on the orientations or positional relationships shown in the drawings, are merely for convenience in describing the present disclosure and to simplify the description, and do not indicate or imply that the device or elements referred to must have a particular orientation, be constructed and operated in a particular orientation, and therefore should not be construed as limiting the present disclosure.

Figure 2:
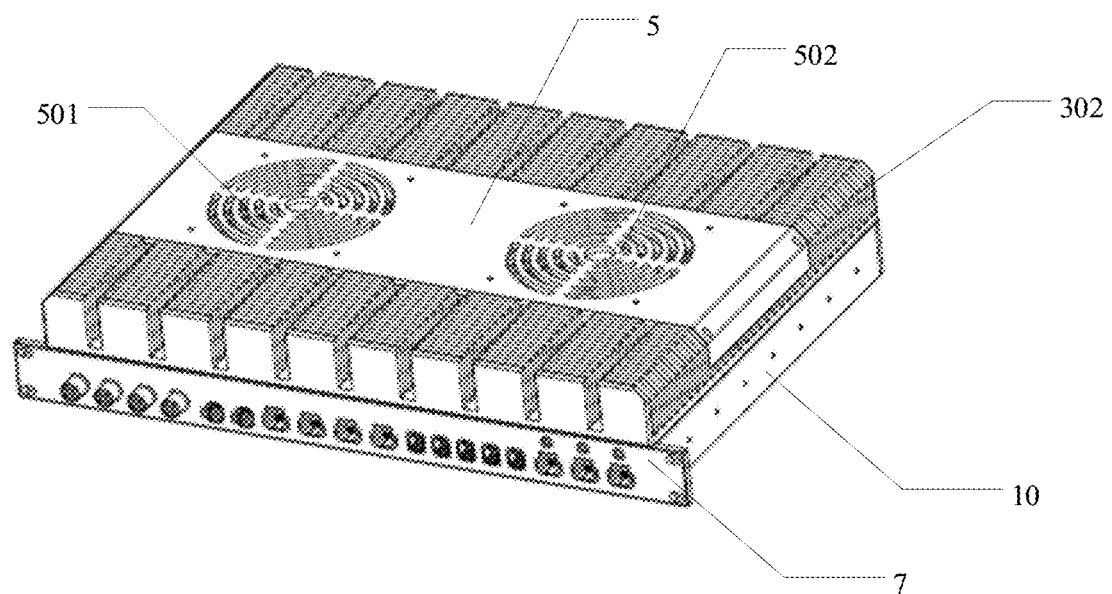
FIG. 2 is a three-dimensional schematic diagram of a structure of a control device according to an embodiment of the present disclosure.

Referring to FIG. 1 and FIG. 2, the control device according to an embodiment of the present disclosure comprises a circuit board 1, a thermally conductive strip 2, a heat dissipation cover 3 and a fan 4.

The heat dissipation cover 3 comprises a heat dissipation cover plate 301 and a plurality of heat dissipation fins 302 arranged on the heat dissipation cover plate 301. The heat dissipation cover plate 301 covers the circuit board 1, and a through groove is formed between the plurality of heat dissipation fins 302.

A first surface of the thermally conductive strip 2 abuts against the circuit board 1, and a second surface of the thermally conductive strip abuts against the heat dissipation cover plate 301. Thus, the thermally conductive strip 2 is disposed on the circuit board 1, and the heat dissipation cover plate 301 is disposed on the thermally conductive strip 2, so that heat generated by the heat-generating elements on the circuit board 1 is transferred to the heat dissipation fins 302 through the thermally conductive strip 2 and the heat dissipation cover plate 301.

The fan 4 are arranged in the through groove for generating an airflow parallel to planes of the heat dissipation fins 302. The main function of the fan 4 is to blow air onto the heat dissipation fins 302, so that the airflow passes over the heat dissipation fins 302 to carry out heat.

According to an embodiment of the present application, the circuit board 1 comprises a substrate 101 and a mainboard 102. The substrate 101 is used for integrating sensor communication chips, such as a PHY chip (port physical layer chip). The mainboard 102 is above (erected on) the substrate 101 for integrating control chips, such as a CPU chip (central processing unit), a GPU chip (graphics processing unit), a DDR chip (double-rate synchronous dynamic random access memory), an FPGA chip (field-programmable gate array), and an ARM chip.

Correspondingly, the thermally conductive strip 2 comprises a substrate thermally-conductive strip 201 and a mainboard thermally-conductive strip 202. A first surface of the substrate thermally-conductive strip 201 abuts against the substrate 101, and a second surface of the substrate thermally-conductive strip abuts against the heat dissipation cover plate 301. A first surface of the mainboard thermally-conductive strip 202 abuts against the mainboard 102, and a second surface of the mainboard thermally-conductive strip abuts against the heat dissipation cover plate 301.

Optionally, a plurality of first convex plates (not shown in the figures) may be arranged on the substrate 101, for example, a plurality of first convex plates, such as four first convex plates (which is not limited to four) are arranged at a position where a core heat-generating element of the substrate 101 is located. Each first convex plate abuts against the substrate thermally-conductive strip 201 through a thermally conductive silicone pad so as to transfer heat from the substrate 101 to the heat dissipation cover 3 through the first convex plates, the thermally conductive silicone pad and the substrate thermally-conductive strip 201 in sequence, and then the heat is dissipated to the air through the airflow of the fan.

Similarly, a plurality of second convex plates (not shown in the figures) may also be arranged on the mainboard 102, for example, four second convex plates are arranged at four corners of the mainboard 102. Each second convex plate abuts against the mainboard thermally-conductive strip 202 through a thermally conductive silicone pad so as to transfer heat from the mainboard 102 to the heat dissipation cover 3 through the second convex plates, the thermally conductive silicone pad and the mainboard thermally-conductive strip 202 in sequence, and then the heat is dissipated to the air through the airflow of the fan.

It should be noted that, the number, position and height of the first convex plates and the second convex plates can be set by those skilled in the art according to needs, which is not limited in the present disclosure. For example, the number of the first convex plates and the second convex plates are set to two, three, or four. The first convex plates and the second convex plates are all arranged near a core heat-generating element (such as one or more heat-generating elements which produce a lot of heat, or a top-K heat-generating elements in terms of heat production or heat speed) to improve the heat dissipation efficiency of this core heat-generating element.

In some implementations, the height of the first convex plates is greater than or equal to the largest height of elements on the substrate 101, and the height of the second convex plates is greater than or equal to the largest height of elements on the mainboard 102. Herein, the height of the first convex plates is very close to the largest height of the elements on the substrate 101, and the height of the second convex plates is also very close to the largest height of the elements on the mainboard 102. Thus, the thermally conductive strip 2 is prevented from being extruded on the circuit board 1, and the heat conduction efficiency from the circuit board 1 to the thermally conductive strip 2 is also improved as much as possible.

According to an embodiment of the present disclosure, the plurality of heat dissipation fins 302 may comprise a first set of heat dissipation fins and a second set of heat dissipation fins. The first set of heat dissipation fins are located at a first end of the heat dissipation cover plate 301. The second set of heat dissipation fins are located at a second end of the heat dissipation cover plate 301, the height of which being the same as that of the first set of heat dissipation fins. For example, in FIG. 1, the heat dissipation fins located on the left side of the fan 4 constitute the first set of heat dissipation fins, and the heat dissipation fins located on the right side of the fan 4 constitute the second set of heat dissipation fins.

In an implementation, a blank area of a heat dissipation cover plate is disposed between a first set of heat dissipation fins and a second set of heat dissipation fins, and thus a through groove is defined by the blank area of the heat dissipation cover plate, the first set of heat dissipation fins and the second set of heat dissipation fins.

In another implementation, the plurality of heat dissipation fins further comprises a third set of heat dissipation fins. The third set of heat dissipation fins are arranged between the first set of heat dissipation fins and the second set of heat dissipation fins, the height of which being less than that of the first set of heat dissipation fins, and a through groove is defined by the third set of heat dissipation fins, the first set of heat dissipation fins and the second set of heat dissipation fins. As shown in FIG. 1, the heat dissipation fins located below the fan 4 and having a significantly lower height are the third set of heat dissipation fins.

According to an embodiment of the present disclosure, the control device may further comprise a fan bracket 5 above (or erected on) the through groove. The fan bracket 5 has the same length as the heat dissipation cover 3 and the same width as the through groove. At this point, a cavity for mounting the fan is defined by the fan bracket 5, the first set of heat dissipation fins, the second set of heat dissipation fins and the third set of heat dissipation fins.

Optionally, the fan 4 may comprise a first fan and a second fan. Correspondingly, the fan bracket 5 comprises a first air vent 501 corresponding to the first fan and a second air vent 502 corresponding to the second fan. A laser etching logo and a serial number can also be designed on the fan bracket 5.

According to another embodiment of the present application, the control device may further comprise a bottom shell 6 for supporting the substrate 101. A plurality of third convex plates 601 are arranged on the bottom shell 6, and each third convex plates abuts against a back surface of the substrate 101 through a thermally conductive silicone pad so as to conduct heat of the substrate 101 to the bottom shell.

Generally, the substrate 101 has a plurality of heat-generating elements, so that the third convex plates 601 on the bottom shell 6 can be arranged at lower portions of a corresponding heat-generating element (i.e., right below a corresponding heat-generating element), respectively, thereby facilitating heat from the substrate 101 to be directly and rapidly transferred to the bottom shell 6. The shape of the upper surface of each third convex plate 601 may be the same as that of lower surface of the corresponding heat-generating element, for example, FIG. 1 is designed with an L-shaped third convex plate 601 and a rectangular third convex plate 601.

It can be seen that the substrate 101 of the present application dissipates heat from two directions. In one aspect, the substrate 101 is mounted on the bottom shell 6, the back surface of the substrate 101 and the bottom shell 6 are conducted through the thermally conductive silicone pad and the third convex plates 601, and at this point, the heat of the substrate 101 is transferred downwards. In another aspect, the main heat-generating elements on the substrate 101 and the heat dissipation cover 3 are conducted through the substrate thermally-conductive strip 201, so that the airflow of the fan 4 takes away the heat in the heat dissipation cover plate 301 and the heat dissipation fins 302, and at this point, the heat of the substrate 101 is transferred upwards.

According to another embodiment of the present application, the control device may further comprise a front vertical plate 7, a rear vertical plate 8, a left vertical plate 9 and a right vertical plate 10, a closed cavity for fixing and protecting the circuit board being formed between the front vertical plate 7, the rear vertical plate 8, the left vertical plate 9 and the right vertical plate 10, and the heat dissipation cover 3 and the bottom shell 6 so as to prevent dust from entering.

In addition, the thermally conductive strip 2, the heat dissipation cover 3, the first convex plates, the second convex plates, the third convex plates 601 and the bottom shell 6 are made of metal materials, so that heat generated by the circuit board 1 can be effectively conducted and dissipated.

In this embodiment, the main heat-generating elements of the circuit board 1 are distributed on a surface contacting the thermally conductive strip 2, and the thermally conductive silicone pad and the thermally conductive strip 2 cover the main heat-generating elements during mounting to generate compression contact, so that heat is directly conducted onto the heat dissipation cover 3. Then, the airflow is accelerated to pass over the heat dissipation fins 302 by the air supply and exhaust fan on the heat dissipation cover 3, thereby dissipating most of the heat out. In the present application, with sealing design of the circuit board 1 inside the device, the heat dissipation cover 3 seals the circuit board 1 in the cavity at the bottom as a holistic upper cover, and the fan 4 are mounted on the heat dissipation cover 3, which ensures that the airflow blows from the outside of the device.

Moreover, the present disclosure adopts a whole piece of heat dissipation cover 3 without adopting a small piece of conventional heat dissipation structure, so that there is no need to mount a heat dissipation structure on each heat-generating element during mounting, only the heat dissipation cover 3 is buckled on the left and right vertical plates, the through groove is formed by processing the heat dissipation fins of different heights to place the fan 4, and the heat dissipation cover contacts the heat-generating elements through the convex plates and the thermally conductive silicone pad so as to achieve a laminated heat dissipation effect. The present application realizes sealing, dustproof and heat dissipation of the circuit board 1 simultaneously, and is simple in structure and easy to mount and maintain.

It should be understood by those skilled in the art that the above description is only specific embodiments of the present disclosure, but the protection scope of the present disclosure is not limited thereto. It will be apparent to those skilled in the art that various changes and modifications may be made to the present application without departing from the spirit and scope of the present application. Thus, if such modifications and variations of the present disclosure fall within the scope of the claims of the present application and the equivalents thereof, the present application is intended to include such modifications and variations as well.

What is claimed is:

1. A control device, comprising:
   a circuit board comprising a substrate and a mainboard disposed on the substrate;
   a heat dissipation cover comprising:
   a heat dissipation cover plate covering the substrate and the mainboard; and
   a plurality of heat dissipation fins arranged on the heat dissipation cover plate, wherein a groove is disposed between the plurality of heat dissipation fins;

a thermally conductive strip disposed between the circuit board and the heat dissipation cover plate; and a fan arranged in the groove;

wherein:

the mainboard is disposed between the substrate and the heat dissipation cover plate;

the thermally conductive strip comprises:
- a mainboard thermally-conductive strip disposed between the mainboard and the heat dissipation cover plate, the mainboard thermally-conductive strip covering the mainboard and exposing a part of the substrate; and
- a substrate thermally-conductive strip disposed between the substrate and the heat dissipation cover plate and disposed at an exposed part of the substrate;

wherein a surface of the substrate thermally-conductive strip and a surface of the mainboard thermally-conductive strip are coplanar.

2. The control device according to claim 1, further comprising:

communication chips disposed on the substrate; and control chips disposed on the mainboard.

3. The control device according to claim 2, wherein the control device further comprises:

a bottom shell configured for supporting the substrate; and a plurality of third convex plates arranged on the bottom shell, wherein each third convex plate abuts against a back surface of the substrate through a thermally conductive silicone pad so as to conduct heat from the substrate to the bottom shell.

4. The control device according to claim 3, wherein the control device further comprises a front vertical plate, a rear vertical plate, a left vertical plate and a right vertical plate, a closed cavity for fixing and protecting the circuit board being formed between the front vertical plate, the rear vertical plate, the left vertical plate and the right vertical plate, and the heat dissipation cover and the bottom shell.

5. The control device according to claim 3, wherein each third convex plate is arranged below a corresponding heat-generating element on the bottom shell, thereby facilitating heat to be transferred from the substrate to the bottom shell.

6. The control device according to claim 5, wherein a shape of an upper surface of each third convex plate is same as that of a lower surface of the corresponding heat-generating element on the bottom shell.

7. The control device according to claim 1, further comprising a plurality of first convex plates and a plurality of second convex plates, wherein:

the plurality of first convex plates are arranged on a side of the substrate facing the heat dissipation cover plate, and each first convex plate abuts against a substrate thermally-conductive strip through a thermally conductive silicone pad;

the plurality of second convex plates are arranged on a side of the mainboard facing the heat dissipation cover plate, and each second convex plate abuts against a mainboard thermally-conductive strip through a thermally conductive silicone pad.

8. The control device according to claim 7, wherein:

a height of the plurality of first convex plates is greater than or equal to a largest height of heat-generating elements on the substrate; and a height of the plurality of second convex plate is greater than or equal to the largest height of heat-generating elements on the mainboard.

9. The control device according to claim 1, wherein the plurality of heat dissipation fins comprises:

a first set of heat dissipation fins disposed at a first end of the heat dissipation cover plate; and a second set of heat dissipation fins disposed at a second end of the heat dissipation cover plate and having a height same as that of the first set of heat dissipation fins, and wherein the groove is disposed between the second set of heat dissipation fins and the first set of heat dissipation fins.

10. The control device according to claim 9, wherein the plurality of heat dissipation fins further comprises:

a third set of heat dissipation fins disposed between the first set of heat dissipation fins and the second set of heat dissipation fins and having a height less than that of the first set of heat dissipation fins, and wherein the groove is defined by the third set of heat dissipation fins, the first set of heat dissipation fins and the second set of heat dissipation fins.

11. The control device according to claim 10, further comprising:

a fan bracket disposed above the groove, and wherein a cavity for mounting the fan is defined by the fan bracket, the first set of heat dissipation fins, the second set of heat dissipation fins and the third set of heat dissipation fins.

12. The control device according to claim 11, wherein:

the fan comprises a first fan and a second fan;

the fan bracket comprises a first air vent corresponding to the first fan and a second air vent corresponding to the second fan.

13. The control device according to claim 11, wherein the fan bracket has a same length as a length of the heat dissipation cover and a same width as a width of the groove.

14. The control device according to claim 1, wherein:

heat generated by the mainboard is transferred upward to the plurality of heat dissipation fins arranged on the heat dissipation cover plate through the mainboard thermally-conductive strip.

15. The control device according to claim 1, wherein:

heat generated by the substrate is transferred downward to a bottom shell through a plurality of third convex plates arranged on the bottom shell and is transferred upward to the heat dissipation cover plate through the substrate thermally-conductive strip.

16. A method for providing a control device, comprising:

providing a circuit board comprising a substrate and a mainboard disposed on the substrate;

providing a heat dissipation cover plate to cover the circuit board, the heat dissipation cover plate comprising:
- a heat dissipation cover plate to cover the substrate and the mainboard; and
- a plurality of heat dissipation fins arranged on the heat dissipation cover plate, wherein a groove is formed between the plurality of heat dissipation fins;

providing a thermally conductive strip having a first surface contacting the circuit board, and a second surface contacting the heat dissipation cover plate; and providing a fan in the groove;

wherein:
the mainboard is disposed between the substrate and the heat dissipation cover plate;
providing the thermally conductive strip comprises:
- a mainboard thermally-conductive strip disposed between the mainboard and the heat dissipation cover plate, the mainboard thermally-conductive strip covering the mainboard and exposing a part of the substrate; and
- a substrate thermally-conductive strip disposed between the substrate and the heat dissipation cover plate and disposed at an exposed part of the substrate;
wherein a surface of the substrate thermally-conductive strip and a surface of the mainboard thermally-conductive strip are coplanar.

17. The method according to claim 16, wherein providing the circuit board comprises:
providing the substrate on which communication chips are disposed; and
providing the mainboard above the substrate, wherein control chips are disposed on the mainboard.

18. The method according to claim 17, further comprising:
providing a plurality of first convex plates on a side of the substrate facing the heat dissipation cover plate, wherein each first convex plate abuts against the substrate thermally-conductive strip through a thermally conductive silicone pad; and
providing a plurality of second convex plates on a side of the mainboard facing the heat dissipation cover plate, wherein each second convex plate abuts against the mainboard thermally-conductive strip through a thermally conductive silicone pad.

19. The method according to claim 16, wherein providing the plurality of heat dissipation fins comprises:
providing a first set of heat dissipation fins at a first end of the heat dissipation cover plate; and
providing a second set of heat dissipation fins at a second end of the heat dissipation cover plate, wherein a height of the second set of heat dissipation fins is same as that of the first set of heat dissipation fins, and the groove is formed between the second set of heat dissipation fins and the first set of heat dissipation fins.

20. The method according to claim 19, wherein providing the plurality of heat dissipation fins further comprises:
providing a third set of heat dissipation fins between the first set of heat dissipation fins and the second set of heat dissipation fins, wherein a height of the third set of heat dissipation fins is less than that of the first set of heat dissipation fins, and the groove is defined by the third set of heat dissipation fins, the first set of heat dissipation fins and the second set of heat dissipation fins.

* * * * *